United States Patent
Kakutani et al.

(10) Patent No.: US 9,576,927 B2
(45) Date of Patent: Feb. 21, 2017

(54) BONDING TOOL COOLING APPARATUS AND METHOD FOR COOLING BONDING TOOL

(71) Applicant: SHINKAWA LTD., Tokyo (JP)

(72) Inventors: Osamu Kakutani, Tokyo (JP); Takatoshi Kawamura, Tokyo (JP); Kohei Seyama, Tokyo (JP); Akira Sato, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 84 days.

(21) Appl. No.: 14/731,431

(22) Filed: Jun. 5, 2015

(65) Prior Publication Data

US 2015/0333032 A1 Nov. 19, 2015

Related U.S. Application Data

(63) Continuation of application No. PCT/JP2013/077759, filed on Oct. 11, 2013.

(30) Foreign Application Priority Data

Dec. 5, 2012 (JP) ................. 2012-266179

(51) Int. Cl.
| | |
|---|---|
| *B29C 65/00* | (2006.01) |
| *B32B 37/08* | (2006.01) |
| *B32B 43/00* | (2006.01) |
| *F16K 49/00* | (2006.01) |
| *F16L 53/00* | (2006.01) |
| *H01L 23/00* | (2006.01) |
| *B32B 37/06* | (2006.01) |
| *B29C 65/44* | (2006.01) |
| *B29C 65/18* | (2006.01) |

(Continued)

(52) U.S. Cl.
CPC ............... *H01L 24/75* (2013.01); *B29C 65/18* (2013.01); *B29C 65/44* (2013.01); *B32B 37/06* (2013.01); *B32B 37/08* (2013.01); *H01L 24/83* (2013.01); *B29K 2701/10* (2013.01); *B29L 2031/3406* (2013.01); *B32B 37/10* (2013.01); *B32B 2307/202* (2013.01); *B32B 2457/14* (2013.01); *H01L 24/29* (2013.01); *H01L 24/32* (2013.01);
(Continued)

(58) Field of Classification Search
USPC ......... 156/282, 285, 498, 538; 137/334, 338
See application file for complete search history.

(56) References Cited

U.S. PATENT DOCUMENTS

| | | | | |
|---|---|---|---|---|
| 5,203,401 A | * | 4/1993 | Hamburgen | ......... G01R 1/0458 |
| | | | | 165/104.32 |
| 5,923,086 A | * | 7/1999 | Winer | ................... H01L 23/467 |
| | | | | 257/707 |

(Continued)

FOREIGN PATENT DOCUMENTS

| | | |
|---|---|---|
| JP | 05-003223 | 1/1993 |
| JP | 11-251361 | 9/1999 |
| JP | 2004-047670 | 2/2004 |

*Primary Examiner* — Sing P Chan
(74) *Attorney, Agent, or Firm* — Jianq Chyun IP Office

(57) ABSTRACT

A bonding tool cooling apparatus (10) provided in the vicinity of a bonding stage, including a frame (12); a cooling member (16) including a ground plate (14) having a ground surface (14*a*) on which a front edge surface of a bonding tool (61) is grounded, and a heat radiation fin (15) attached to an opposite surface of the ground plate (14) to the ground surface (14*a*), wherein the cooling member (16) is supported on the frame (12) by a support mechanism (200) so that the cooling member (16) is rotatable about two axes, i.e., an X axis extending along the ground surface (14*a*) and a Y axis extending along the ground surface (14*a*). Bonding tool cooling time can be thereby reduced.

6 Claims, 7 Drawing Sheets

(51) Int. Cl.
*B29K 701/10* (2006.01)
*B29L 31/34* (2006.01)
*B32B 37/10* (2006.01)

(52) U.S. Cl.
CPC .................. *H01L 2224/2919* (2013.01); *H01L 2224/32225* (2013.01); *H01L 2224/755* (2013.01); *H01L 2224/7525* (2013.01); *H01L 2224/75251* (2013.01); *H01L 2224/75252* (2013.01); *H01L 2224/75501* (2013.01); *H01L 2224/75744* (2013.01); *H01L 2224/75802* (2013.01); *H01L 2224/75803* (2013.01); *H01L 2224/75824* (2013.01); *H01L 2224/832* (2013.01); *H01L 2224/83192* (2013.01); *H01L 2224/83203* (2013.01); *H01L 2224/83862* (2013.01)

(56) References Cited

U.S. PATENT DOCUMENTS

| | | | | |
|---|---|---|---|---|
| 6,199,259 | B1 * | 3/2001 | Demaray | C23C 14/3407 204/298.12 |
| 6,477,053 | B1 * | 11/2002 | Zeidan | H05K 7/20127 165/80.3 |
| 7,717,984 | B1 * | 5/2010 | Schreiber | B03C 3/08 96/30 |
| 9,093,549 | B2 * | 7/2015 | Wasserman | B23K 3/085 |
| 9,368,372 | B1 * | 6/2016 | Okishima | H01L 21/4842 |
| 9,425,162 | B2 * | 8/2016 | Wasserman | B23K 3/085 |
| 9,458,756 | B2 * | 10/2016 | Arai | B60K 11/02 |
| 2006/0289987 | A1 * | 12/2006 | Chiu | H01L 23/473 257/714 |
| 2013/0181037 | A1 * | 7/2013 | Nagai | H01L 24/75 228/103 |
| 2015/0008254 | A1 * | 1/2015 | Wasserman | B23K 3/085 228/180.1 |
| 2015/0129135 | A1 * | 5/2015 | Lee | H01L 24/75 156/378 |
| 2015/0173209 | A1 * | 6/2015 | Dhavaleswarapu | B23K 3/085 228/194 |
| 2015/0287693 | A1 * | 10/2015 | Wasserman | B23K 3/085 228/178 |
| 2015/0380381 | A1 * | 12/2015 | Seyama | H01L 24/75 228/180.22 |
| 2015/0382480 | A1 * | 12/2015 | Frick | H01L 24/00 228/180.1 |

* cited by examiner

BONDING TOOL COOLING APPARATUS AND METHOD FOR COOLING BONDING TOOL

CROSS REFERENCE TO RELATED APPLICATIONS

This application is a Continuation of PCT International Application No. PCT/JP2013/077759, filed on Oct. 11, 2013, which claims priority under 35 U.S.C. §119(a) to Patent Application No. 2012-266179, filed in Japan on Dec. 5, 2012, all of which are hereby expressly incorporated by reference into the present application.

TECHNICAL FIELD

The present invention relates to the structure of a cooling apparatus for a bonding tool for mounting an electronic component such as a semiconductor chip on a substrate using thermosetting resin, and a method for cooling a bonding tool.

BACKGROUND ART

It is frequently seen that electronic components such as a semiconductor chip are mounted on a substrate by means of a bonding tool. Recently, there is known a method for bonding a semiconductor chip to a substrate by applying thermosetting resin onto a substrate in advance, pressing a semiconductor chip suctioned with the bonding tool on the resin-applied substrate, heating electronic components such as the semiconductor chip suctioned at a front edge of the bonding tool by means of a heater within the bonding tool, and hardening the thermosetting resin (see, for example, Patent Literature 1).

CITATION LIST

Patent Literature

[Patent Literature 1] Japanese Patent Application Laid-Open No. 2004-47670

SUMMARY OF INVENTION

Technical Problem

Incidentally, while the thermosetting resin described in Patent Literature 1 is high viscosity liquid at ordinary temperature, the thermosetting resin has a property of being hardened when being heated. Owing to this, if a semiconductor chip in a high temperature state contacts the thermosetting resin applied onto the substrate, the upper surface of the thermosetting resin contacting the semiconductor chip is hardened, and only the outer surface of the thermosetting resin is hardened before sufficiently heating and hardening the interior of the thermosetting resin, with the result that the semiconductor chip cannot be appropriately bonded to the substrate.

Considering this problem, the following procedures are taken at a time of bonding the semiconductor chip to the substrate by means of the thermosetting resin. The temperature of the bonding tool is decreased to such a degree that the thermosetting resin is not hardened even though the front edge of the bonding tool in a state of the increased temperature by the preceding bonding suctions the semiconductor chip. Thereafter, the front edge of the bonding tool suctions the semiconductor chip, and the low-temperature semiconductor chip is pressed on the surface of the thermosetting resin. The semiconductor chip, the substrate, and the thermosetting resin are then heated by means of the heater within the bonding tool and a heater within a bonding stage to fixedly suction the substrate, and the entire thermosetting resin is hardened.

Nevertheless, it takes quite a long time to decrease the temperature of the bonding tool that has increased up to about 150° C. to about 200° C. so as to harden the thermosetting resin to, for example, a temperature approximately near the ordinary temperature. The bonding tool cooling time disadvantageously and greatly influences the time of the entire bonding process using the thermosetting resin.

Therefore, an object of the present invention is to reduce bonding tool cooling time.

Solution to Problem

A bonding tool cooling apparatus according to the present invention is a bonding tool cooling apparatus including: a base portion; and a cooling member including a ground plate having a ground surface on which a front edge surface of a bonding tool is grounded, and a heat radiation member attached to the ground plate, wherein the cooling member is supported on the base portion by a support mechanism that makes a direction of the ground surface variable depending on a direction of the front edge surface of the bonding tool.

In the bonding tool cooling apparatus according to the present invention, it is preferable that a heat capacity of the cooling member is larger than a heat capacity of the bonding tool. It is preferable that the heat radiation member is attached to an opposite surface of the ground plate to the ground surface. It is preferable that the heat radiation member is a heat radiation fin, and that the bonding tool cooling apparatus includes a cooling fan for cooling the heat radiation fin. It is preferable that the support mechanism supports the ground plate on the base portion so that the ground plate is rotatable about two axes, the two axes being a first axis extending along the ground surface and a second axis extending along the ground surface and orthogonal to the first axis.

The bonding tool cooling apparatus according to the present invention preferably includes a cooling nozzle provided on the base portion for blowing out cooling air to the bonding tool having the front edge surface grounded on the ground surface. It is also preferable that heat transfer occurs from the bonding tool to the ground plate when the front edge surface of the bonding tool is grounded on the ground surface of the ground plate.

A method for cooling a bonding tool according to the present invention includes: preparing a bonding tool cooling apparatus including base portion; and a cooling member including a ground plate having a ground surface on which a front edge surface of a bonding tool for suctioning an electronic component is grounded, and a heat radiation member attached to the ground plate, wherein the cooling member is supported on the base portion by a support mechanism that makes a direction of the ground surface variable depending on a direction of the front edge surface of the bonding tool, wherein a heat capacity of the cooling member is larger than a heat capacity of the bonding tool, and wherein the bonding tool cooling apparatus including a cooling fan for cooling the heat radiation member; cooling the cooling member by the cooling fan while the bonding tool is heated to carry out bonding of an electronic component; and after the bonding, cooling the bonding tool by closely attaching the front edge surface of the bonding tool that is at a high temperature by being heated to the ground surface of the cooling member at a decreased temperature.

Advantageous Effect of Invention

According to the present invention, it is advantageously possible to reduce the bonding tool cooling time.

DESCRIPTION OF EMBODIMENTS

Before a bonding tool cooling apparatus according to the present invention is described with reference to the drawings, a bonding apparatus 100 provided with the bonding tool cooling apparatus according to an embodiment of the present invention will be described.

Figure 1:
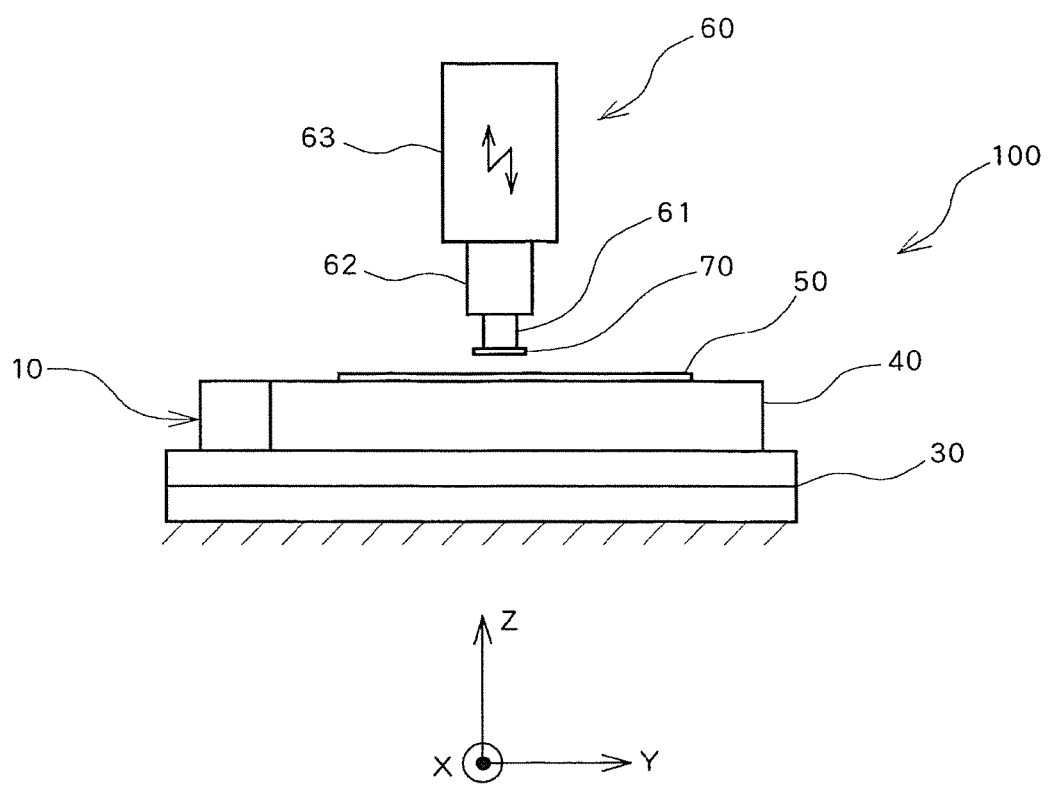
FIG. 1 is an explanatory diagram showing a bonding apparatus provided with a bonding tool cooling apparatus according to an embodiment of the present invention.

As shown in FIG. 1, the bonding apparatus 100 includes an XY table 30 having an upper portion that moves horizontally in X and Y directions, a bonding stage 40 attached onto the XY table 30, a bonding head 60 that includes a Z direction drive unit 63 for moving a bonding tool 61 in a direction (Z direction) closer to or separate from the bonding stage 40 and a shank 62 that is attached to the Z direction drive unit 63 and to which the bonding tool 61 is fixed, and a bonding tool cooling apparatus 10 arranged to be adjacent to the bonding stage 40.

The bonding stage 40 of the bonding apparatus 100, which includes inside a heater (not shown) and to which a vacuum device (not shown) is connected, can fixedly suction and heat a substrate 50. The bonding tool 61 is also connected to the vacuum device (not shown) and configured so that a front edge thereof can suction a semiconductor chip 70. Furthermore, a heater is mounted in the bonding tool 61, and the bonding tool 61 can heat the semiconductor chip 70 that is an electronic component suctioned by the front edge of the bonding tool 61 with the heater.

Figure 2:
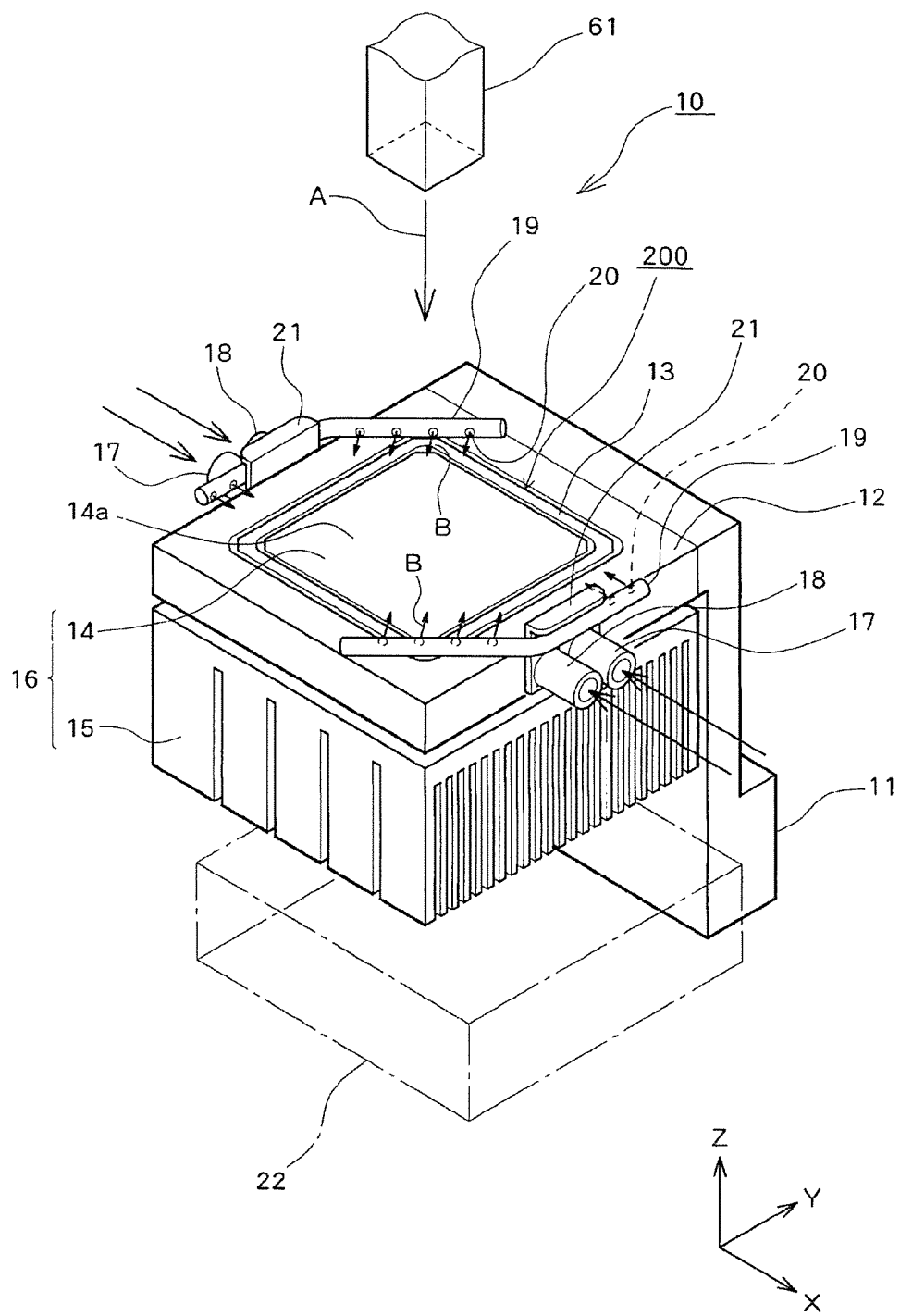
FIG. 2 is a perspective view of the bonding tool cooling apparatus according to the embodiment of the present invention.
Figure 3:
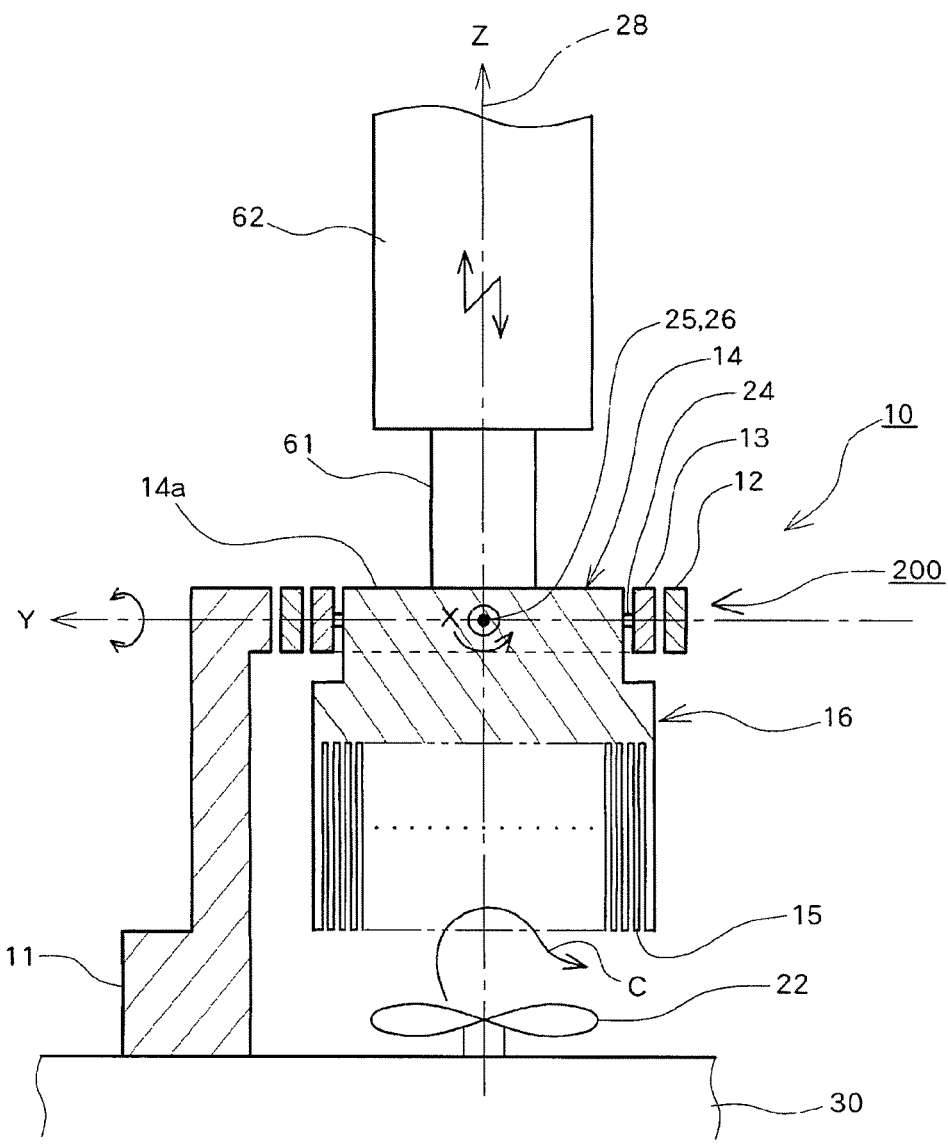
FIG. 3 is a cross-sectional view of the bonding tool cooling apparatus according to the embodiment of the present invention.

As shown in FIGS. 2 and 3, the bonding tool cooling apparatus 10 according to the embodiment includes a frame 12 that is a base portion and a cooling member 16 that includes a ground plate 14 having a ground surface 14a on which the front edge of the bonding tool 61 is grounded and a heat radiation fin 15 that is a heat radiation member attached to an opposite surface of the ground plate 14 to the ground surface 14a. The ground plate 14 is attached to the frame 12 so that a direction of the ground surface 14a is variable by a support mechanism 200. Furthermore, a cooling nozzle 19 jetting cooling air from an air supply hole 20 along near the surface of the ground surface 14a and cooling-air supply tubes 17 and 18 supplying the cooling air to the cooling nozzle 19 are attached to each side surface of the frame 12 via a bracket 21. The frame 12 is fixed onto the XY table 30, as shown in FIG. 1, with an attachment bracket 11. A cooling fan 22 blowing out the cooling air to the heat radiation fin 15 of the cooling member 16 is arranged under the heat radiation fin 15.

Figure 4:
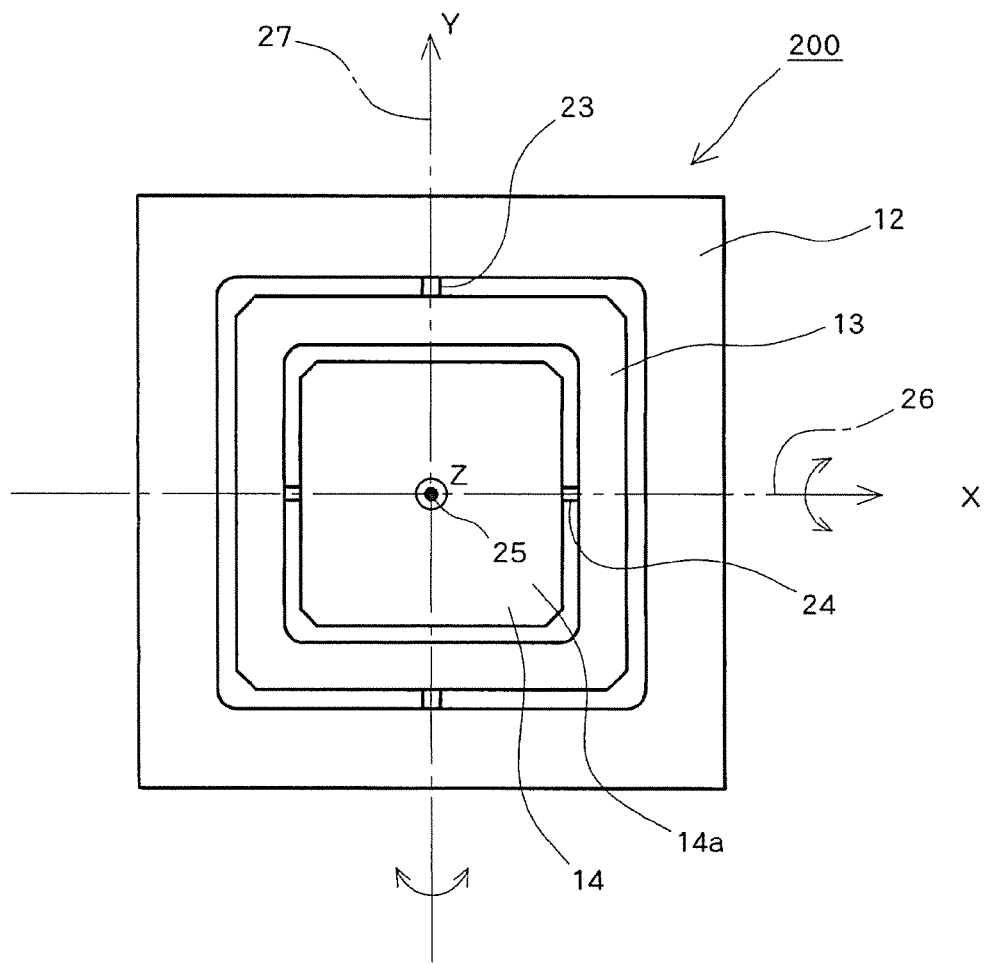
FIG. 4 is a plan view showing a state of attaching a ground plate of the bonding tool cooling apparatus according to the embodiment of the present invention.

As shown in FIGS. 3 and 4, the support mechanism 200 is configured with a rectangular annular intermediate frame 13 arranged inside of a rectangular opening of the frame 12 with pins 23 so as to be rotatable about a Y axis 27 that is a second axis orthogonal to an X axis 26 passing through a center 25 of the ground plate 14 and extending along the ground surface 14a, and pins 24 mounted inside of the intermediate frame 13 and supporting the ground plate 14 rotatably about the X axis 26 that is a first axis passing through the center 25 of the ground plate 14 and extending along the ground surface 14a. Therefore, the ground surface 14 is rotatable, relatively to the frame 12, about the X axis 26 and the Y axis 27 that pass through the center 25, and is supported, so that a direction or tilt of the ground surface 14a is variable relatively to the frame 12. Moreover, as shown in FIG. 3, the heat radiation fin 15 is fixed to the lower surface (opposite surface to the ground surface 14a) of the ground plate 14, and moves integrally with the ground plate 14. Therefore, the cooling member 16 including the ground plate 14 and the heat radiation fin 15 is rotatable about the X axis 26 and the Y axis 27 that pass through the center 25 of the ground plate 14 as a whole.

The ground surface 14a that is one surface of the ground plate 14 is a flat surface to which a front edge surface of the bonding tool 61 can be closely attached, and the cooling member 16 including the ground plate 14 and the heat radiation fin 15 is configured so that a heat capacity of the cooling member 16 is larger than that of the bonding tool 61.

Operation performed by the bonding tool cooling apparatus 10 configured as described above will now be described with reference to FIG. 5.

A temperature of the bonding tool 61 completed with bonding, as shown in FIG. 5(a), is in a high temperature state of, for example, about 150° C. The XY table 30 shown in FIG. 1 is driven to align a center of the bonding tool 61 to a center of the bonding tool cooling apparatus 10. At this time, the cooling fan 22 of the bonding tool cooling apparatus 10 rotates and supplies the cooling air to the heat radiation fin 15 as indicated by an arrow C in FIG. 5(a). Therefore, the ground plate 14 and the heat radiation fin 15 are generally in an ordinary temperature state.

Figure 5:
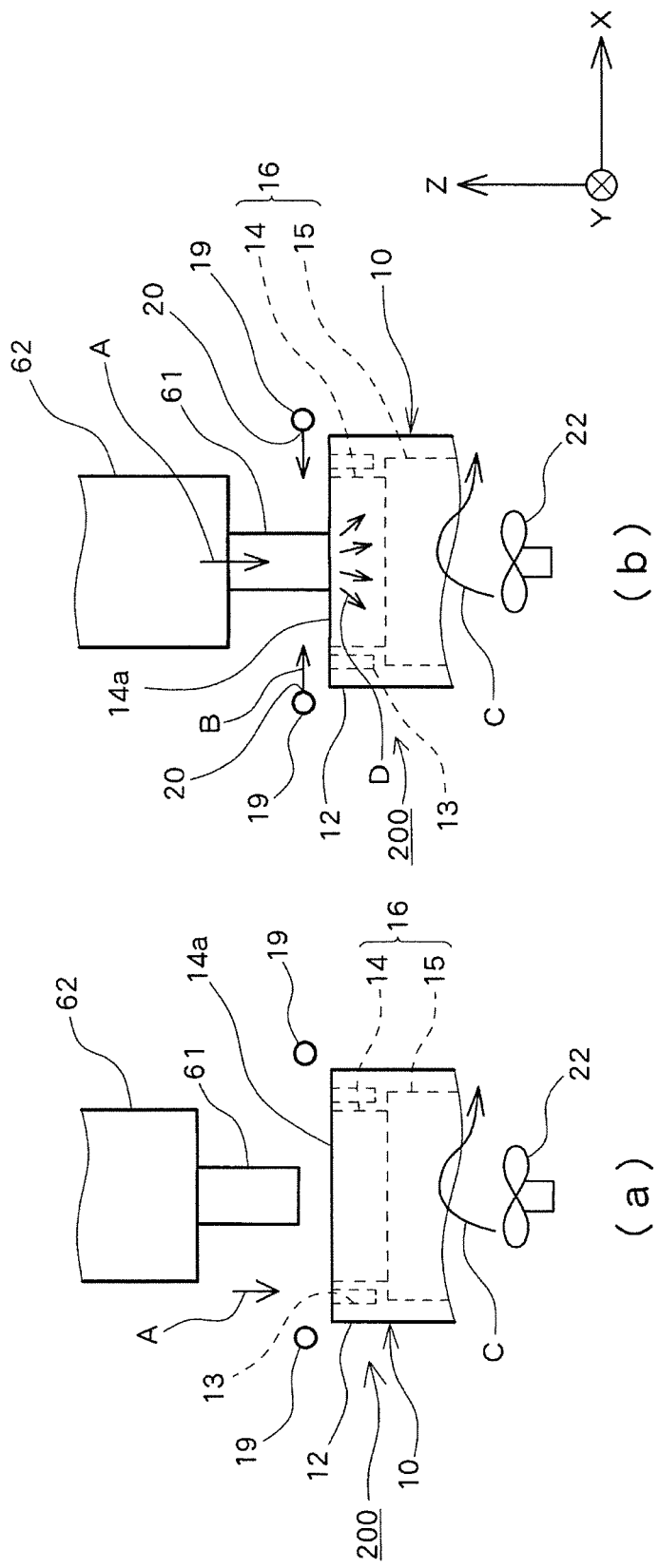
FIG. 5 is an explanatory diagram showing operation performed by the bonding tool cooling apparatus according to the embodiment of the present invention.

As shown in FIG. 5(b), the Z direction drive unit 63 of the bonding head 60 shown in FIG. 1 is driven to move the bonding tool 61 in a downward direction (minus side of the Z direction) as indicated by an arrow A shown in FIG. 5(b) to ground the front edge surface of the bonding tool 61 on the ground surface 14a that is one surface of the ground plate 14. As described with reference to FIGS. 3 and 4, the ground plate 14 is attached to the frame 12 so as to be rotatable about the X axis 26 and the Y axis 27 passing through the center of the ground plate 14 relatively to the frame 12 by the support mechanism 200. Therefore, the ground plate 14 rotates about the X axis 26 and the Y axis 27 with the tilt of the ground surface 14a (direction of the ground surface 14a) varying depending on the tilt of the front edge surface (direction of the front edge surface) of the bonding tool 61. The front edge surface of the bonding tool 61 is thereby closely attached to the ground surface 14*a*. Since the ground surface 14 is integrally fixed to the heat radiation fin 15, heat of the bonding tool 61 flows toward the ground plate 14 and the heat radiation fin 15 that are held at the ordinary temperature as indicated by an arrow D of FIG. 5(*b*) when the front edge surface of the bonding tool 61 is closely attached to the ground surface 14*a*. Since the cooling member 16 including the ground plate 14 and the heat radiation fin 15 are configured so that the heat capacity of the cooling member 16 is larger than that of the bonding tool 61, the temperature of the bonding tool 61 rapidly decreases. Moreover, when the front edge surface of the bonding tool 61 is closely attached to the ground surface 14*a* of the ground plate 14, the cooling air is jetted from the air supply holes 20 of the cooling nozzles 19 attached laterally to the frame 12 in a direction along the ground surface 14*a* (an arrow B direction) to strike on the front edge of the bonding tool 61, thus cooling the bonding tool 61 also from an outer surface of the bonding tool 61.

If the bonding tool 61 is closely attached to the ground surface 14*a* of the ground plate 14 for predetermined time, the temperature of the bonding tool 61 decreases to the temperature at which the temperature of the semiconductor chip 70 is not equal to a temperature of starting hardening the thermosetting resin even with the front edge of the bonding tool 61 suctioning the semiconductor chip 70. Therefore, the semiconductor chip 70 is fixed to the substrate 50 by allowing the front edge surface of the bonding tool 61 to suction the semiconductor chip 70, pressing the semiconductor chip 70 onto the thermosetting resin on the substrate 50 fixedly suctioned with the surface of the bonding stage 40 shown in FIG. 1, heating the semiconductor chip 70 with the heater (not shown) provided within the bonding tool 61, and hardening the thermosetting resin.

In contrast, as shown in FIG. 5(*a*), the cooling fan 22 of the bonding tool cooling apparatus 10 continues to supply the cooling air to the heat radiation fin 15 even after the front edge surface of the bonding tool 61 is away from the ground surface 14*a* of the ground plate 14. Owing to this, the cooling member 16 configured with the ground plate 14 and the heat radiation fin 15 is cooled to a temperature close to the ordinary temperature while the semiconductor chip 70 is bonded by means of the bonding tool 61.

Thereafter, the front edge surface of the bonding tool 61 that is completed with the bonding and the temperature of which is as high as, for example, about 150° C. is closely attached again to the ground surface 14*a* of the ground plate 14 at the temperature close to the ordinary temperature. It is thereby possible to cool the bonding tool 61 in short time.

As described so far, the bonding tool cooling apparatus 10 according to the embodiment of the present invention is one that transfers the heat of the bonding tool 61 to the cooling member 16 by closely attaching the front edge surface of the bonding tool 61 at the high temperature to the ground surface 14*a* of the cooling member 16 at the ordinary temperature and larger in heat capacity, and that rapidly cools the bonding tool 61. Furthermore, by cooling the cooling member 16 to decrease the temperature thereof to that near the ordinary temperature while the bonding is carried out using the bonding tool 61, it is advantageously possible to shorten takt time of the bonding process and to efficiently carry out the bonding. The front edge surface of the bonding tool 61 is not completely closely attached to the ground surface 14*a* of the cooling member 16 but suffices to contact the ground surface 14*a* to the extent that the heat of the bonding tool 61 can be transferred to the cooling member 16 and that the bonding tool 61 can be rapidly cooled.

In the embodiment described so far, the bonding apparatus 100 has been described as being configured to move the bonding stage 40 in the X and Y directions by the XY table 30. Needless to say, the bonding tool cooling apparatus 10 according to the present invention is applicable to a bonding apparatus configured differently from that described in the embodiment. For example, the bonding apparatus 100 can be configured, so that the substrate 50 is moved in the X direction by a transport mechanism that transports the substrate 50 with guide rails, an immovable bonding stage is arranged between the guide rails, the bonding head 60 is movable in the Z direction and the Y direction, and so that the bonding tool cooling apparatus 10 is arranged near the bonding stage outside of the guide rails that transport the substrate or provided adjacent to the bonding stage inside of the guide rails. Alternatively, in a case where the bonding apparatus is configured to attach a bonding arm to the bonding head so as to move a front edge of the bonding arm in X, Y, and Z directions, the bonding tool cooling apparatus 10 can be arranged wherever near the bonding stage as long as the bonding arm can move the bonding tool.

Furthermore, as shown in FIGS. 3 and 4, in the embodiment, it has been described that the ground plate 14 is attached to the frame 12 by the support mechanism 200 using a combination of the two types of pins 23 and 24 with the intermediate frame 13 so that the ground plate 14 is rotatable about each of the X axis and the Y axis. However, the configuration of the support mechanism is not limited to that described in the embodiment as long as the ground plate 14 is rotatable about each of the X axis and the Y axis, and the support mechanism can be configured as described below.

Figure 6:
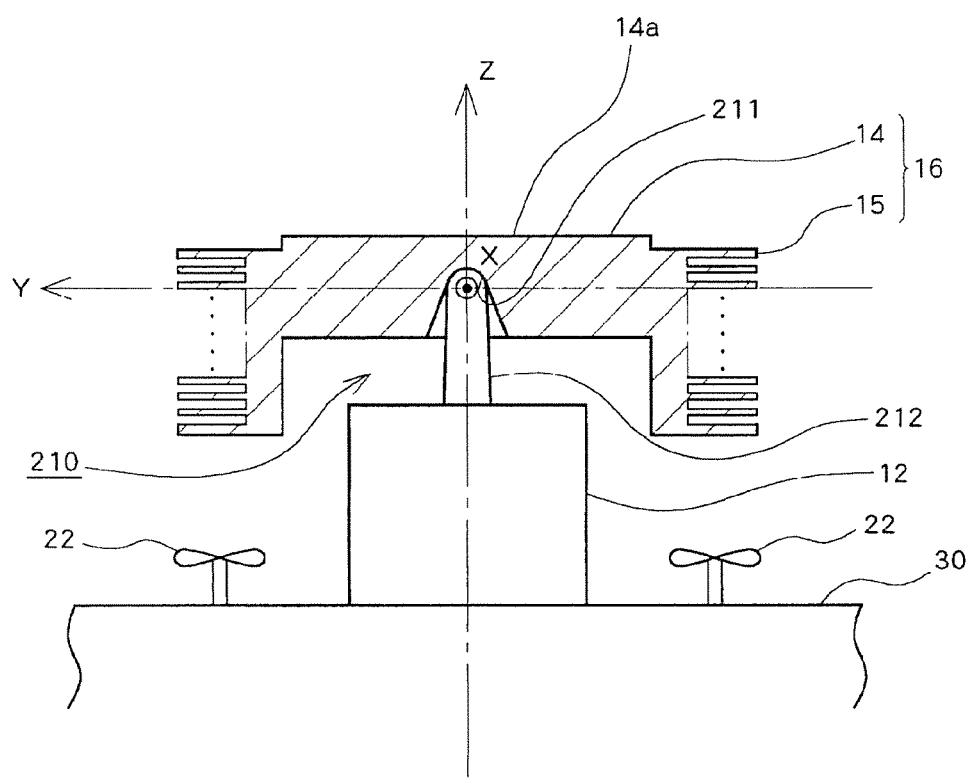
FIG. 6 is a cross-sectional view of a bonding tool cooling apparatus according to another embodiment of the present invention.
Figure 7:
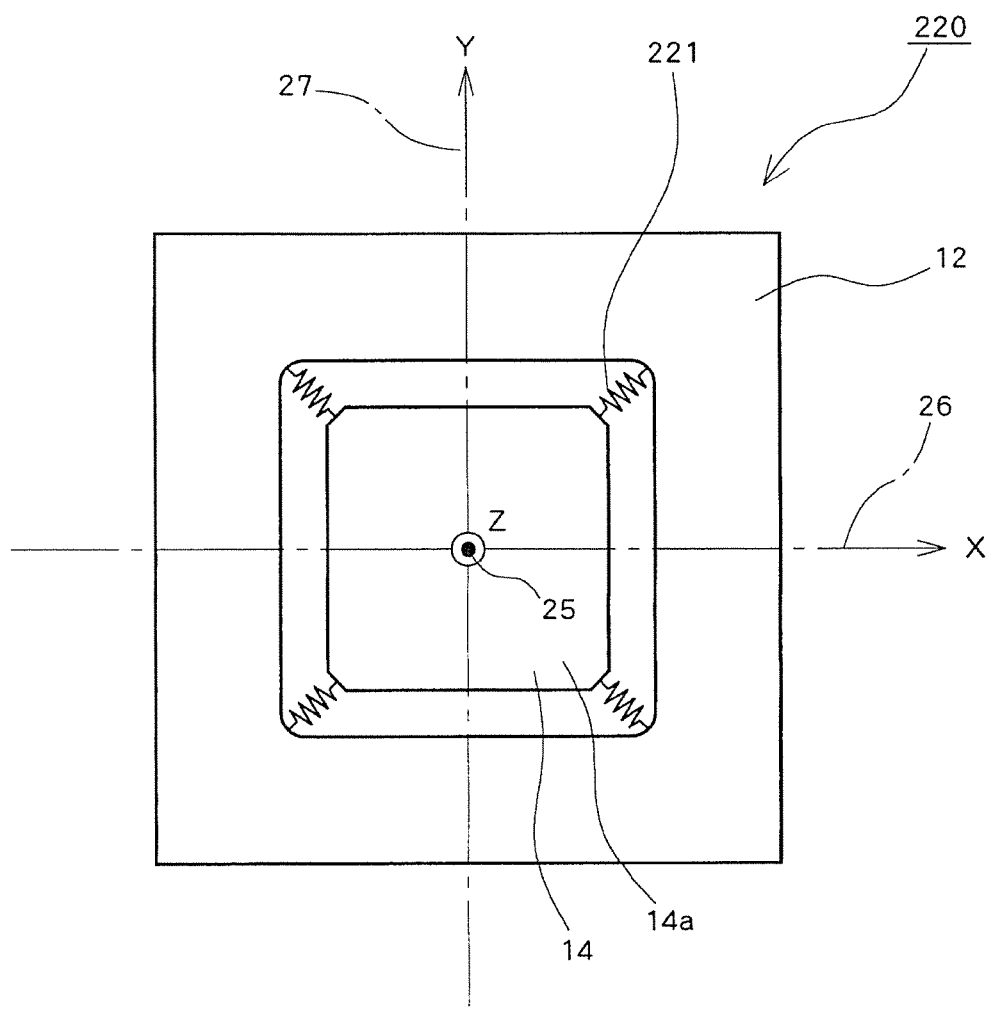
FIG. 7 is a plan view showing the bonding tool cooling apparatus according to yet another embodiment of the present invention.

Other embodiments of the present invention will be described with reference to FIGS. 6 and 7. In FIGS. 6 and 7, the same constituent elements as those in the embodiment described with reference to FIGS. 1 to 5 are denoted by the same reference signs and not repeatedly described. In the embodiment shown in FIG. 6, the support mechanism 200 according to the embodiment described with reference to FIGS. 1 to 5 is replaced by a pivot support mechanism 210 for pivotally supporting a dimple 211 provided in the lower surface of the ground plate 14 with a support pin 212 provided on the frame 12. In the embodiment shown in FIG. 7, the support mechanism 200 according to the embodiment described with reference to FIGS. 1 to 5 is replaced by a spring support mechanism 220 for supporting four corners of the ground plate 14 with springs 221, respectively. Alternatively, in place of the pivot support mechanism 210 in the embodiment shown in FIG. 6, a spherical pedestal provided on the frame 12 can used to support a spherical dimple provided in the lower surface of the ground plate 14. In the embodiments shown in FIGS. 6 and 7, the ground plate 14 is rotatable not only in each of the X axis and the Y axis but also in the Z axis. Furthermore, it suffices that the heat radiation fin 15 is integral with the ground plate 14 so as to be able to radiate the heat of the ground plate 14. As shown in FIG. 6, the heat radiation fins 15 can be arranged laterally to the ground plate 14. Furthermore, the cooling member 16 can cool the bonding tool 61 by using not the heat radiation fin 15 but by refrigerant other than the air by, for example, circulating cooling water inside.

The present invention is not limited to the embodiments described so far but covers all changes and modifications without departure from the technical scope or concept of the present invention defined by claims.

The invention claimed is:

1. A bonding tool cooling apparatus, comprising:
    a base portion;
    a cooling member, comprising:
        a ground plate having a ground surface on which a front edge surface of a bonding tool is grounded, and
        a heat radiation fin attached to the ground plate; and
    a cooling fan for cooling the heat radiation fin, wherein
    the cooling member is supported on the base portion by a support mechanism that makes a direction of the ground surface variable depending on a direction of the front edge surface of the bonding tool.

2. The bonding tool cooling apparatus according to claim 1, wherein the heat radiation fin is attached to a surface opposite to the ground surface of the ground plate.

3. The bonding tool cooling apparatus according to claim 1, wherein
    the support mechanism supports the ground plate on the base portion, so that the ground plate is rotatable about two axes,
    the two axes being a first axis extending along the ground surface and a second axis extending along the ground surface and orthogonal to the first axis.

4. The bonding tool cooling apparatus according to claim 1, comprising:
    a cooling nozzle provided on the base portion for blowing out cooling air to the bonding tool having the front edge surface grounded on the ground surface.

5. The bonding tool cooling apparatus according to claim 1, wherein
    heat transfer occurs from the bonding tool to the ground plate when the front edge surface of the bonding tool is grounded on the ground surface of the ground plate.

6. A method for cooling a bonding tool, comprising:
    preparing a bonding tool cooling apparatus, the bonding tool cooling apparatus comprising:
        a base portion;
        a cooling member, comprising:
            a ground plate having a ground surface on which a front edge surface of a bonding tool for suctioning an electronic component is grounded, and
            a heat radiation fin attached to the ground plate; and
        a cooling fan for cooling the heat radiation fin, wherein
            the cooling member is supported on the base portion by a support mechanism that makes a direction of the ground surface variable depending on a direction of the front edge surface of the bonding tool,
    cooling the cooling member by the cooling fan while the bonding tool is heated to carry out a bonding process of the electronic component; and
    after the bonding process, cooling the bonding tool by closely attaching the front edge surface of the bonding tool that is at a high temperature by being heated to the ground surface of the cooling member at a decreased temperature.

* * * * *